(12) United States Patent
Choi et al.

(10) Patent No.: US 9,704,815 B2
(45) Date of Patent: Jul. 11, 2017

(54) PACKAGE SUBSTRATE AND SEMICONDUCTOR PACKAGE INCLUDING THE SAME

(71) Applicant: Samsung Electronics Co., Ltd., Suwon-si, Gyeonggi-do (KR)

(72) Inventors: Mi-Na Choi, Yongin-si (KR); Young-Deuk Kim, Seoul (KR); Jae-Choon Kim, Incheon (KR); Eon-Soo Jang, Suwon-si (KR); Hee-Jung Hwang, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/156,327

(22) Filed: May 16, 2016

(65) Prior Publication Data

US 2016/0372423 A1    Dec. 22, 2016

(30) Foreign Application Priority Data

Jun. 16, 2015    (KR) .................. 10-2015-0084926

(51) Int. Cl.
*H01L 23/00* (2006.01)
*H01L 23/538* (2006.01)
(Continued)

(52) U.S. Cl.
CPC .......... *H01L 23/562* (2013.01); *H01L 21/561* (2013.01); *H01L 23/49811* (2013.01); *H01L 23/5386* (2013.01); *H01L 24/97* (2013.01); *H01L 23/3121* (2013.01); *H01L 24/16* (2013.01); *H01L 24/48* (2013.01); *H01L 24/49* (2013.01); *H01L 24/81* (2013.01); *H01L 2224/0401* (2013.01); *H01L 2224/04042* (2013.01); *H01L 2224/16235* (2013.01); *H01L 2224/48091* (2013.01);
(Continued)

(58) Field of Classification Search
CPC ............. H01L 23/562; H01L 23/49811; H01L 23/5386
See application file for complete search history.

(56) References Cited

U.S. PATENT DOCUMENTS

| | | | |
|---|---|---|---|
| 6,734,571 B2 * | 5/2004 | Bolken | ................ H01L 21/565 249/52 |
| 7,538,432 B1 | 5/2009 | Danovitch et al. | |
| 8,800,137 B2 | 8/2014 | Kim et al. | |

FOREIGN PATENT DOCUMENTS

| | | |
|---|---|---|
| JP | 10341075 | 12/1998 |
| KR | 100362499 | 11/2002 |

(Continued)

*Primary Examiner* — David Vu
(74) *Attorney, Agent, or Firm* — Renaissance IP Law Group LLP

(57) ABSTRACT

A package substrate may include an insulating substrate, internal circuits and a warpage-suppressing member. The insulating substrate may have a plurality of mount regions in which semiconductor chips may be mounted, and a peripheral region. The internal circuits may be arranged in the mount regions. The warpage-suppressing member is different from the semiconductor chips and may be arranged in at least one of the mount regions to suppress a warpage of the insulating substrate. Thus, warpage of the package substrate may be suppressed during a reflow process.

18 Claims, 9 Drawing Sheets

(51) Int. Cl.
*H01L 23/498* (2006.01)
*H01L 21/56* (2006.01)
*H01L 23/31* (2006.01)

(52) U.S. Cl.
CPC ............ *H01L 2224/48235* (2013.01); *H01L 2224/49175* (2013.01); *H01L 2224/81815* (2013.01); *H01L 2224/97* (2013.01); *H01L 2924/15311* (2013.01); *H01L 2924/15313* (2013.01); *H01L 2924/3511* (2013.01)

(56) References Cited

FOREIGN PATENT DOCUMENTS

| | | |
|---|---|---|
| KR | 100378093 | 3/2003 |
| KR | 100384336 | 5/2003 |
| KR | 100542667 | 1/2006 |
| KR | 100680950 | 2/2007 |
| KR | 20090020197 | 2/2009 |
| KR | 101095623 | 12/2011 |
| KR | 20130033150 | 4/2013 |

* cited by examiner

PACKAGE SUBSTRATE AND SEMICONDUCTOR PACKAGE INCLUDING THE SAME

CROSS-REFERENCE TO RELATED APPLICATION

This application claims priority under 35 USC §119 to Korean Patent Application No. 10-2015-0084926, filed on Jun. 16, 2015 in the Korean Intellectual Property Office (KIPO), the contents of which are herein incorporated by reference in their entirety.

BACKGROUND

1. Technical Field

Example embodiments relate to a package substrate and a semiconductor package including the same. More particularly, example embodiments relate to a package substrate on which a plurality of semiconductor chips may be mounted, and a semiconductor package including such a package substrate.

2. Description of the Related Art

Generally, a flip chip package may include a semiconductor chip, conductive bumps and a package substrate. The conductive bumps may be interposed between the semiconductor chip and the package substrate to electrically connect pads of the semiconductor chip with an internal circuit of the package substrate. The flip chip package may be manufactured by a reflow process for attaching the semiconductor chips onto an upper surface of the package substrate using the conductive bumps, a molding process for molding the semiconductor chips, a cutting process for cutting the package substrate to singulate the semiconductor chips, and a mounting process for mounting external terminals on a lower surface of the package substrate.

When manufacturing the package substrate, an abnormal internal circuit may be generated. Because it may not be required to electrically connect semiconductor chips to abnormal internal circuits, semiconductor chip may not be mounted onto regions of an upper surface of the package substrate where any abnormal internal circuits are located.

However, regions of the package substrate where semiconductor chips are not mounted may be weaker than other regions of the package substrate where semiconductor chips are mounted. Thus, during the reflow process (i.e., a high-temperature process), the weak portion of the package substrate may be severely bent due to a difference of thermal expansion coefficients between the semiconductor chips and the package substrate.

SUMMARY

Example embodiments provide a package substrate that may not be bent in a reflow process. Example embodiments also provide a semiconductor package including the above-mentioned package substrate.

According to one example embodiment, there is provided a package substrate that includes an insulating substrate, internal circuits and a warpage-suppressing member. The insulating substrate may have a plurality of mount regions in which semiconductor chips may be mounted, and a peripheral region. The internal circuits may be arranged in the mount regions. The warpage-suppressing member, which is different from the semiconductor chips, may be arranged in at least one of the mount regions to suppress a warpage of the insulating substrate.

According to another example embodiment, there is provided a semiconductor package that includes a package substrate and semiconductor chips. The package substrate may include an insulating substrate, internal circuits and a warpage-suppressing member. The insulating substrate may have a plurality of mount regions in which semiconductor chips may be mounted, and a peripheral region. The internal circuits may be arranged in the mount regions. The warpage-suppressing member may be arranged on at least one of the mount regions to suppress a warpage of the insulating substrate. The semiconductor chips may be mounted in mount regions which are different from the at least one of the mount regions on which the warpage-suppressing member is arranged. The semiconductor chips may be electrically connected with the internal circuits.

According to yet another example embodiment, there is provided a semiconductor package that includes an insulating substrate, internal circuits, semiconductor chips and a warpage-suppressing member. The insulating substrate may include a plurality of mount regions, and the internal circuits may be formed in the mount regions. Some of the internal circuits may be normal internal circuits, and at least one of the internal circuits is an abnormal internal circuit. The semiconductor chips may be mounted on mount regions in which normal internal circuits are formed, and the warpage-suppressing member may be arranged on a mount region in which an abnormal internal circuit is formed.

BRIEF DESCRIPTION OF THE DRAWINGS

Example embodiments will be more clearly understood from the following detailed description taken in conjunction with the accompanying drawings.

FIG. 1 is a plan view illustrating a package substrate in accordance with example embodiments;

FIG. 2 is a cross-sectional view taken along line II-II' shown in FIG. 1;

FIG. 3 is a plan view illustrating a package substrate in accordance with example embodiments;

FIG. 4 is a cross-sectional view taken along line IV-IV' shown in FIG. 3;

FIG. 5 is a cross-sectional view taken along line V-V' shown in FIG. 3;

FIG. 6 is a plan view illustrating a semiconductor package including the package substrate in FIG. 1 in accordance with example embodiments;

FIG. 7 is a cross-sectional view taken along line VII-VII' shown in FIG. 6;

FIG. 8 is a plan view illustrating a semiconductor package including the package substrate in FIG. 1 in accordance with example embodiments; and FIG. 9 is a cross-sectional view taken along line IX-IX' shown in FIG. 8.

DETAILED DESCRIPTION OF THE EMBODIMENTS

Figure 1:
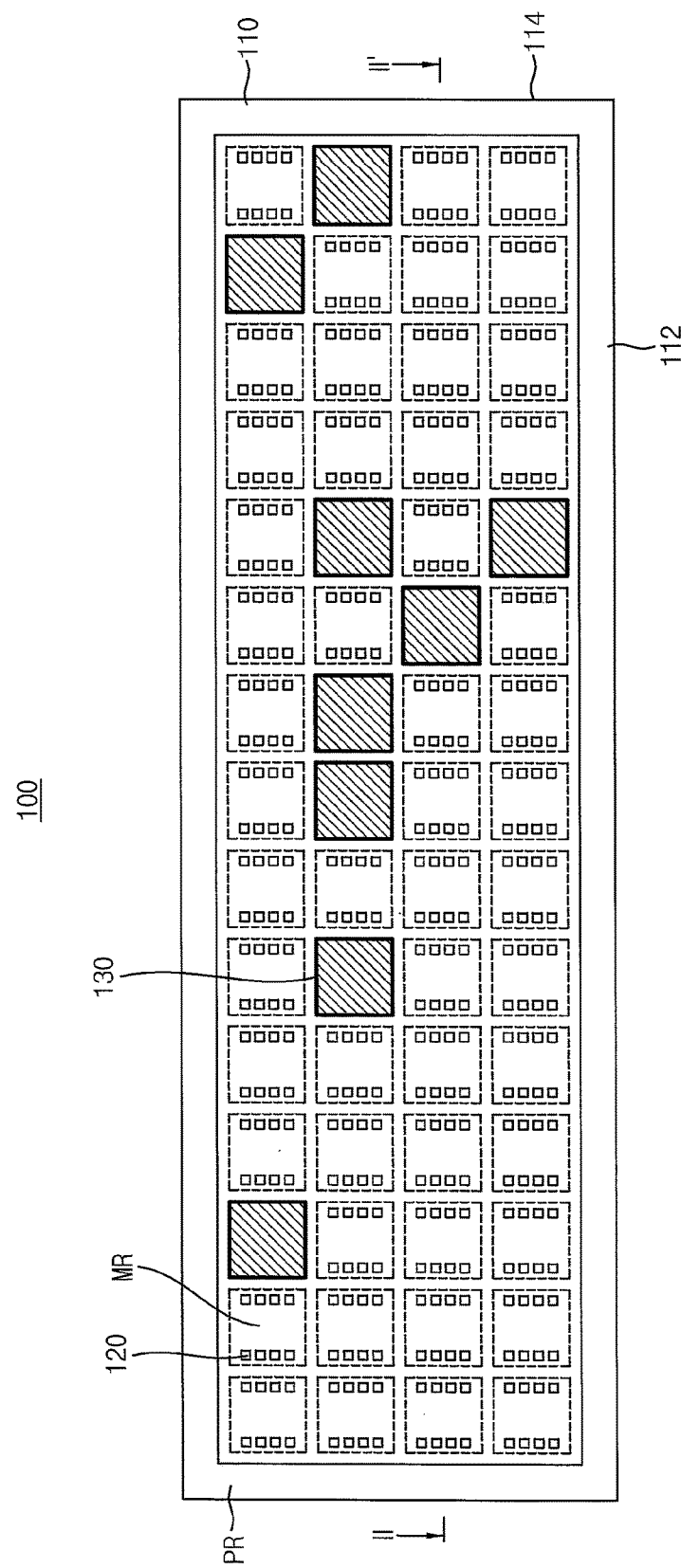
FIGS. 1 to 9 represent non-limiting, example embodiments as described herein.

Various example embodiments will be described more fully hereinafter with reference to the accompanying drawings, in which some example embodiments are shown. These embodiments may, however, be realized in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Package Substrate

Figure 2:
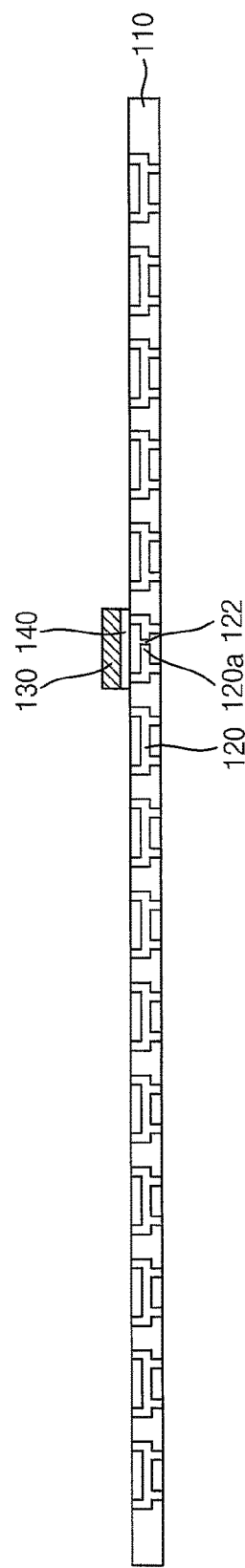

FIG. 1 is a plan view illustrating a package substrate in accordance with example embodiments, and FIG. 2 is a cross-sectional view taken along line II-II' shown in FIG. 1.

Referring to FIGS. 1 and 2, a package substrate 100 of this example embodiment may include an insulating substrate 110, a plurality of internal circuits 120 and at least one warpage-suppressing member 130.

The insulating substrate 110 may have a rectangular shape having two long sides 112 and two short sides 114. It should be recognized, however, that the insulating substrate 110 may have any other suitable or desired shape. The insulating substrate 110 may include any suitable insulating material.

The insulating substrate 110 may have a plurality of mount regions MR and a peripheral region PR. Semiconductor chips may be mounted in the mount regions MR, but not in the peripheral region PR. The mount regions MR may correspond to a central region of the insulating substrate 110, and may be spaced apart from each other (e.g., in left and right directions, etc.). The peripheral region PR may correspond to an edge region of the insulating substrate 110 (e.g., so as to surround the mount regions MR).

The internal circuits 120 may be arranged in the mount regions MR of the insulating substrate 110, but not be arranged in the peripheral region PR. Each of the internal circuits 120 may include an upper end exposed through an upper surface of the mount region MR, and a lower end exposed through a lower surface of the mount region MR. Generally, an internal circuit 120 in one mount region MR may be electrically isolated from an adjacent internal circuit 120 in an adjacent mount region MR. Because the insulating substrate 110 may be cut along scribe lanes between the semiconductor chips to form a plurality of semiconductor packages after mounting the semiconductor chips in the mount regions MR, it may not be required to electrically connect one internal circuit 120 with an adjacent internal circuit 120.

After forming the internal circuits 120 in the mount regions MR, electrical tests may be performed on the internal circuits 120 to determine whether the internal circuits 120 are normal or not. For example, when any one of the internal circuits 120 in the mount region MR has a cut portion (e.g., cut portion 122, as shown in FIG. 2), the internal circuit 120 having the cut portion 122 may be determined to be an abnormal internal circuit 120a. As used herein, an internal circuit can be characterized as being abnormal if it is inoperative, defective or otherwise does not function in the manner in which it was intended. Because it may not be required to mount a semiconductor chip (which can be relatively expensive) on a mount region MR having an abnormal internal circuit 120a, semiconductor chips may be mounted only on the mount regions MR having a normal internal circuits 120, and not on mount regions MR having abnormal internal circuits 120a. Thus, semiconductor chips may not exist in mount regions MR having abnormal internal circuits 120a.

After mounting semiconductor chips on mount regions MR having normal internal circuits 120, the semiconductor chips may be attached to the normal internal circuits 120 during a high temperature attaching process. During the attaching process, the insulating substrate 110 may be bent due to a difference between thermal expansion coefficients between the insulating substrate 110 and the semiconductor chips mounted thereto. The semiconductor chips may support the insulating substrate 110 to suppress the warpage of the insulating substrate 110.

However, as mentioned above, because semiconductor chips may not exist in mount regions MR having abnormal internal circuits 120a, a portion of the insulating substrate 110 corresponding to the mount region MR having the abnormal internal circuit 120a may have a relatively weak strength. As a result, the insulating substrate 110 may be severely bent during the attaching process. Process failures may be generated during packaging processes subsequent performed on the bent insulating substrate 110.

In example embodiments, a warpage-suppressing member 130 may be arranged in a mount region MR having an abnormal internal circuit 120a. The warpage-suppressing member 130 may be attached to the mount region MR having the abnormal internal circuit 120a by any suitable process (e.g., by using an adhesive 140), and may suppress the warpage of the insulating substrate 110 in place of the semiconductor chip. Thus, the warpage-suppressing member 130 may be configured to have a strength that is no less than strength of the semiconductor chip. If the warpage-suppressing member 130 may be upwardly protruded from the semiconductor chips, the package substrate 100 may be damaged. Therefore, the warpage-suppressing member 130 may have an upper surface that is spaced apart from the insulating substrate 110 by a distance that is no more than that by which an upper surface of the semiconductor chip is spaced apart from the insulating substrate 110. In order to reduce a cost of the package substrate 100 from being increased due to the warpage-suppressing member 130, the warpage-suppressing member 130 may include a metal tape, which can be less expensive than a semiconductor chip. For example, the warpage-suppressing member 130 may include a copper tape. However, the warpage-suppressing member 130 may include other metal tapes besides copper tape. Alternatively, the warpage-suppressing member 130 may include an insulating material.

By attaching the warpage-suppressing member 130 in a mount region MR having an abnormal internal circuit 120a, the strength of the package substrate 100 may be reinforced, and warpage of the package substrate 100 may be suppressed during the attaching process. Further, because the warpage-suppressing member 130 may include a relatively inexpensive metal tape, warpage of the package substrate 100 may be suppressed at relatively low cost.

Figure 3:
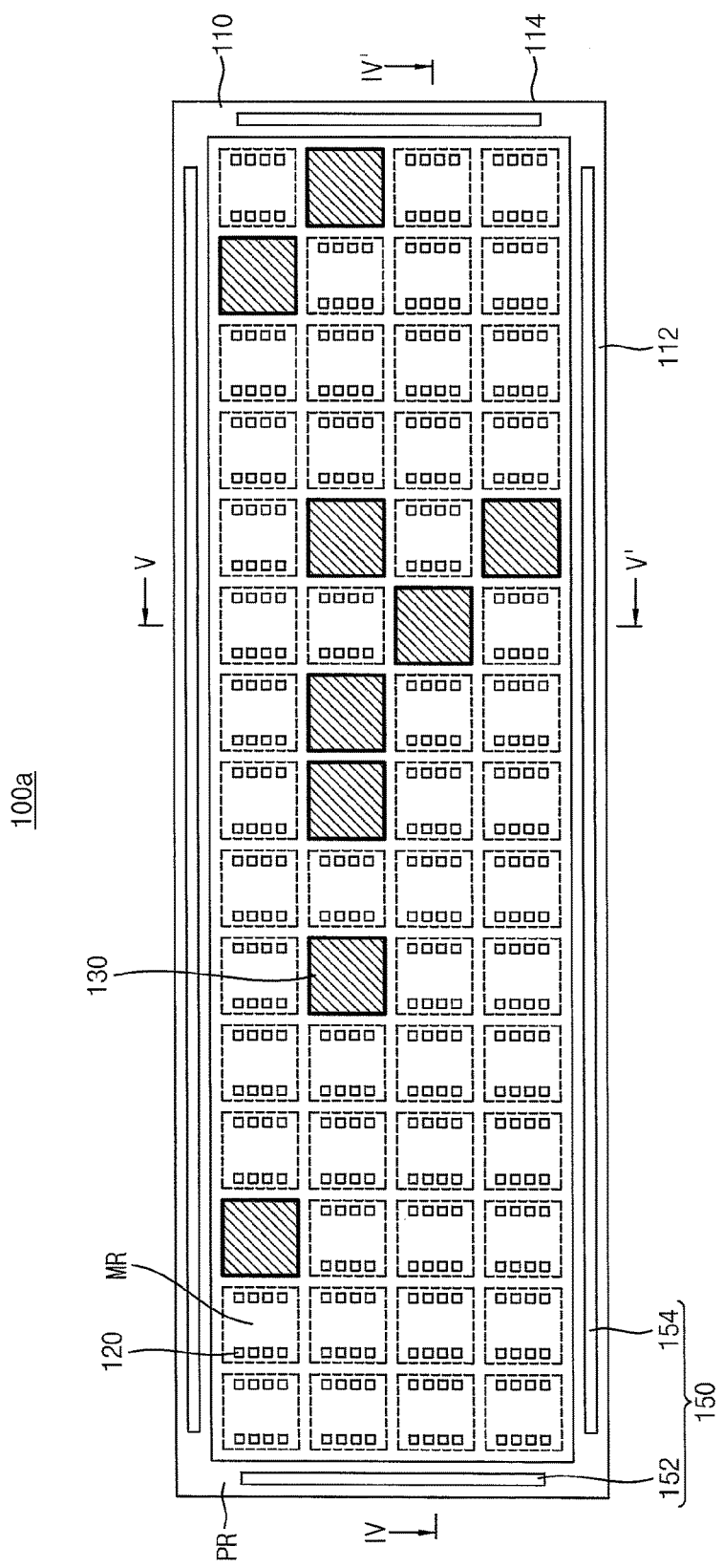
Figure 4:
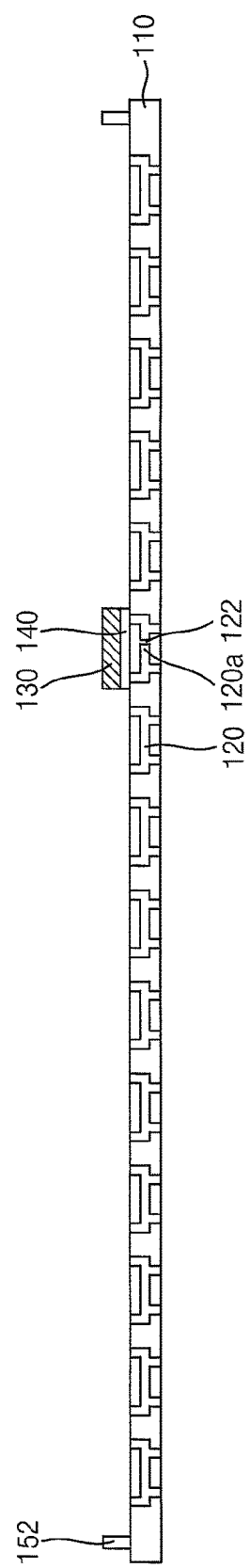
Figure 5:
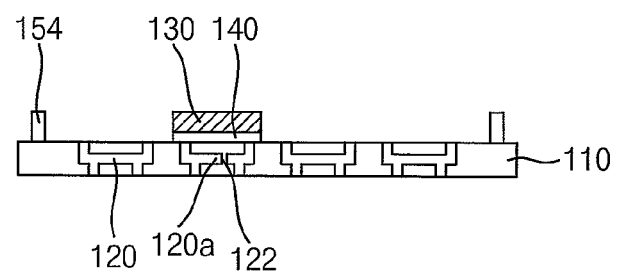

FIG. 3 is a plan view illustrating a package substrate in accordance with example embodiments, FIG. 4 is a cross-sectional view taken along line IV-IV' shown in FIG. 3, and FIG. 5 is a cross-sectional view taken along line V-V' shown in FIG. 3.

A package substrate 100a of this example embodiment may include elements substantially the same as those of the package substrate 100 in FIG. 1, except for further including an auxiliary warpage-suppressing member. Thus, the same reference numerals may refer to the same elements and any further description with respect to those elements are omitted herein for brevity.

Referring to FIGS. 3 to 5, an auxiliary warpage-suppressing member 150 may be arranged in the peripheral region PR of the insulating substrate 110. The auxiliary warpage-suppressing member 150, when provided in addition to the warpage-suppressing member 130, may enhance the degree with which warpage of the insulating substrate 110 can be suppressed. That is, the warpage-suppressing member 130 in the mount region MR and the auxiliary warpage-suppressing member 150 in the peripheral region PR may suppress the warpage of the insulating substrate 110.

The auxiliary warpage-suppressing member 150 may be configured to have a strength that is no less than the strength of the semiconductor chip. The auxiliary warpage-suppressing member 150 may have an upper surface that is spaced apart from the insulating substrate 110 by a distance that is no more than that by which the upper surface of the semiconductor chip is spaced apart from the insulating substrate 110. The auxiliary warpage-suppressing member 150 may include a metal tape such as a copper tape, or the like. The auxiliary warpage-suppressing member 150 may be formed of the same material as the warpage suppressing member 130, or from a different material.

In example embodiments, the auxiliary warpage-suppressing member 150 may include a first auxiliary warpage-suppressing line 152 and a second auxiliary warpage-suppressing line 154. The first auxiliary warpage-suppressing line 152 may be arranged in regions of the peripheral region PR extending along the short sides 114 of the insulating substrate 110. The first auxiliary warpage-suppressing line 152 may extend in a direction that is substantially perpendicular to the long sides 112 of the insulating substrate 110 to suppress the insulating substrate 110 from being bent with respect to the long sides 112 of the insulating substrate 110. The second auxiliary warpage-suppressing line 154 may be arranged in regions of the peripheral region PR extending along the long sides 112 of the insulating substrate 110. The second auxiliary warpage-suppressing line 154 may extend in a direction that is substantially parallel to the long sides 112 of the insulating substrate 110 to suppress the insulating substrate 110 from being bent with respect to the short sides 114 of the insulating substrate 110.

According to this example embodiment, the auxiliary warpage-suppressing 150 member, when taken with the warpage-suppressing member 130, may enhance the degree with which warpage of the package substrate 100a can be suppressed. Further, because the auxiliary warpage-suppressing member 150 may include a relatively inexpensive metal tape, warpage of the package substrate 100a may be suppressed at relatively low cost.

Semiconductor Package

Figure 6:
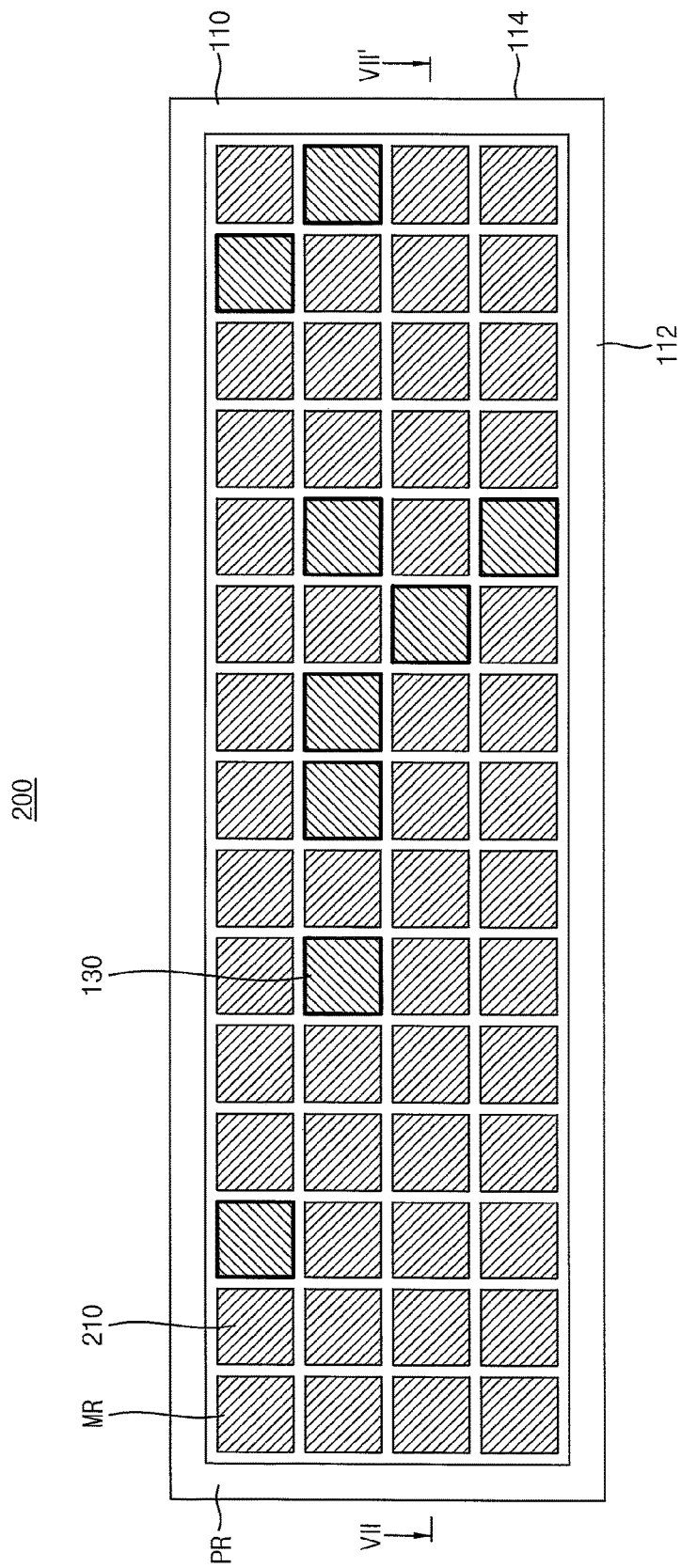
Figure 7:
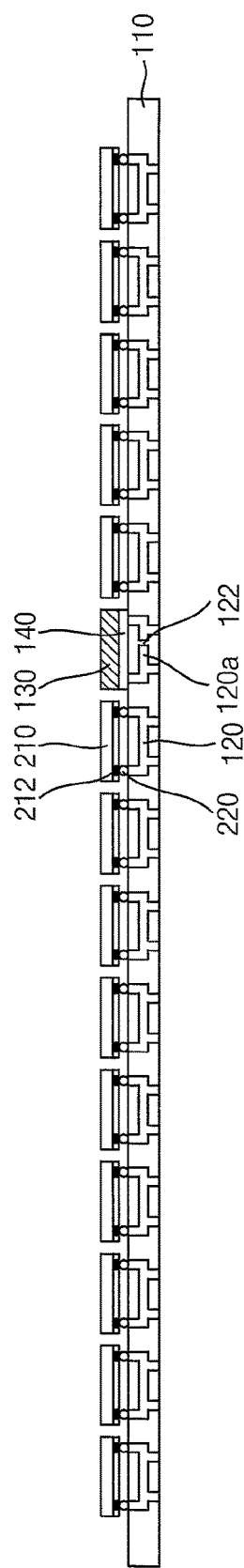

FIG. 6 is a plan view illustrating a semiconductor package including the package substrate in FIG. 1 in accordance with example embodiments, and FIG. 7 is a cross-sectional view taken along line VII-VII' shown in FIG. 6.

Referring to FIGS. 6 and 7, a semiconductor package 200 of this example embodiment may include a package substrate 100, a plurality of semiconductor chips 210 and a plurality of conductive bumps 220.

In the illustrated embodiment, the package substrate 100 may include elements substantially the same as those of the package substrate 100 in FIG. 1. Thus, the same reference numerals may refer to the same elements and any further description with respect to those elements are omitted herein for brevity. Alternatively, the semiconductor package 200 may include the package substrate 100a described with reference to FIG. 3.

The semiconductor chips 210 may be mounted on the mount regions MR of the insulating substrate 110 in which the normal internal circuits 120 are formed, and not on the mount regions MR of the insulating substrate 110 in which abnormal internal circuits 120a are formed. The warpage-suppressing member 130 may be arranged in the mount regions MR of the insulating substrate 110 in which the abnormal internal circuits 120a are formed. Each of the semiconductor chips 210 may include bonding pads 212. The bonding pads 212 may be arranged on a lower surface of a semiconductor chip 210, and may be oriented toward the upper surface of the package substrate 100.

The conductive bumps 220 may be arranged on the bonding pads 212 of the semiconductor chips 210. The conductive bumps 220 may be electrically connected to the upper ends of the internal circuits 120. Thus, the semiconductor package 200 of this example embodiment may correspond to a flip chip package including the conductive bumps 220 interposed between the semiconductor chips 210 and the package substrate 100.

The conductive bumps 220 may be attached to the internal circuits 120 of the package substrate 100 by a reflow process. The warpage-suppressing member 130 may reinforce the strength of the package substrate 100 during the reflow process so that the warpage of the package substrate 100 may be suppressed.

A molding member (not shown) may be formed on the upper surface of the package substrate 100 to cover the semiconductor chips 210. External terminals (not shown) may be mounted on the lower ends of the internal circuits 120, which may be exposed through the lower surface of the package substrate 100. The package substrate 100 may be cut along the scribe lanes between the semiconductor chips 210 to form the semiconductor packages 200.

Figure 8:
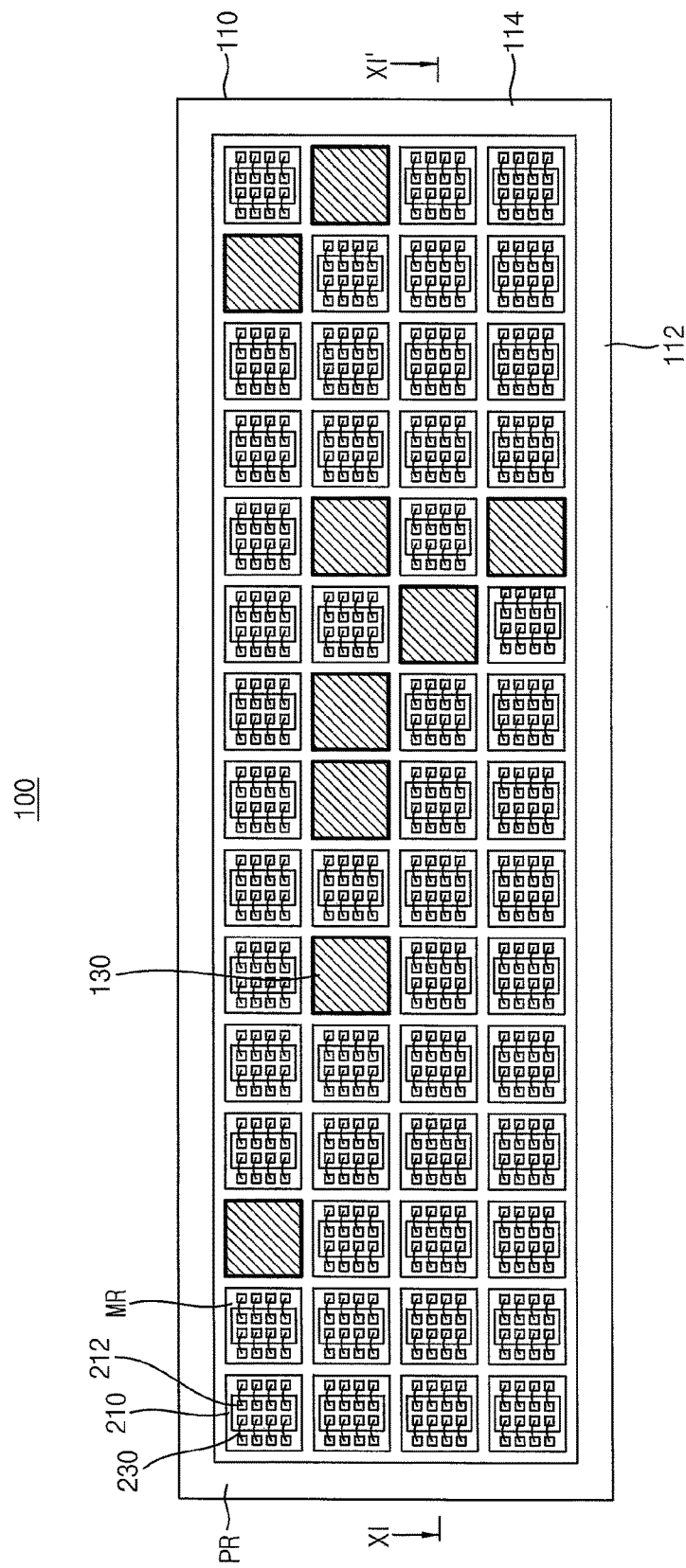
Figure 9:
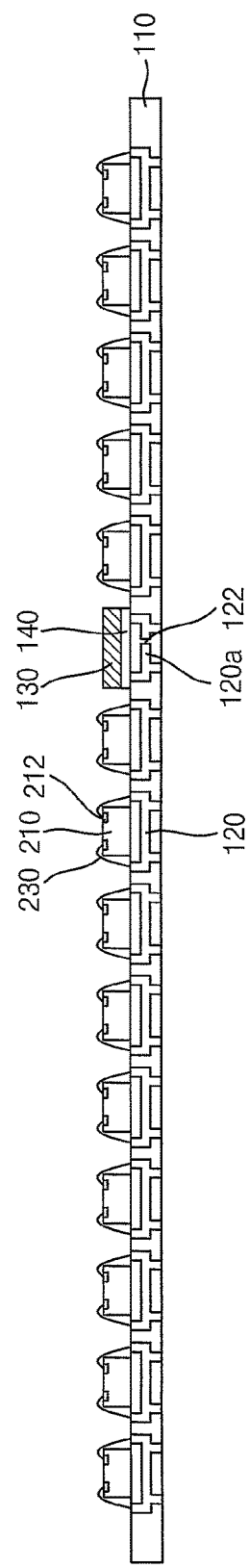

FIG. 8 is a plan view illustrating a semiconductor package including the package substrate in FIG. 1 in accordance with example embodiments, and FIG. 9 is a cross-sectional view taken along line IX-IX' shown in FIG. 8.

Referring to FIGS. 8 and 9, a semiconductor package 200a of this example embodiment may include a package substrate 100, a plurality of semiconductor chips 210 and a plurality of conductive wires 230.

In the illustrated embodiment, the package substrate 100 may include elements substantially the same as those of the package substrate 100 in FIG. 1. Thus, the same reference numerals may refer to the same elements and any further description with respect to those elements are omitted herein for brevity. Alternatively, the semiconductor package 200a may include the package substrate 100a in FIG. 3.

The semiconductor chips 210 may be mounted on the mount regions MR of the insulating substrate 110 in which the normal internal circuits 120 are formed, and not on the mount regions MR of the insulating substrate 110 in which the abnormal internal circuits 120a are formed. The warpage-suppressing member 130 may be arranged in the mount regions MR of the insulating substrate 110 in which the abnormal internal circuits 120a are formed. Each of the semiconductor chips 210 may include bonding pads 212. The bonding pads 212 may be arranged on an upper surface of a semiconductor chip 210, and may be oriented away from the upper surface of the package substrate 100.

The conductive wires 230 may electrically connect the semiconductor chips 210 with the package substrate 100. Each of the conductive wires 230 may include an upper end connected to the bonding pad 212 of the semiconductor chip 210, and a lower end extended from the upper end and connected to the upper end of the internal circuit 120.

A molding member (not shown) may be formed on the upper surface of the package substrate 100 to cover the semiconductor chips 210. External terminals (not shown) may be mounted on the lower ends of the internal circuits 120 exposed through the lower surface of the package substrate 100. The package substrate 100 may be cut along the scribe lanes between the semiconductor chips 210 to form the semiconductor packages 200a.

According to example embodiments, the warpage-suppressing member may have a strength that is no less than the strength of the semiconductor chip arranged in a mount region having a normal internal circuit, and may be arranged in a mount region having an abnormal internal circuit to reinforce the strength of the package substrate. Thus, the warpage of the package substrate may be suppressed during a subsequently-performed reflow process. Because the warpage-suppressing member may include a relatively inexpensive material (e.g., a metal tape, an insulating material, etc.), costs of the package substrate and the semiconductor package may not be greatly increased by provision of the warpage-suppressing member.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A package substrate comprising:
   an insulating substrate having a plurality of mount regions on which semiconductor chips are capable of being mounted, and a peripheral region;
   internal circuits formed in the mount regions of the insulating substrate; and
   a warpage-suppressing member arranged on at least one of the mount regions to suppress a warpage of the insulating substrate, the warpage-suppressing member being different from the semiconductor chips,
   wherein at least one of the internal circuits is an abnormal internal circuit and wherein the warpage-suppressing member is arranged in the mount region in which an abnormal internal circuit is formed.

2. The package substrate of claim 1, wherein the warpage-suppressing member has a strength that is no less than a strength of one of the semiconductor chips.

3. The package substrate of claim 1, wherein the warpage-suppressing member has an upper surface that is spaced apart from the insulating substrate by a distance that is no more than by which an upper surface of the semiconductor chip is spaced apart from the insulating substrate.

4. The package substrate of claim 1, wherein the warpage-suppressing member comprises a metal tape.

5. The package substrate of claim 1, wherein the mount regions comprise a central region of the insulating substrate, and the peripheral region comprises an edge region of the insulating substrate surrounding the central region of the insulating substrate.

6. The package substrate of claim 1, further comprising at least one auxiliary warpage-suppressing member arranged in the peripheral region.

7. The package substrate of claim 6, wherein the auxiliary warpage-suppressing member comprises a first auxiliary warpage-suppressing line extending in a direction substantially perpendicular to a side of the insulating substrate.

8. The package substrate of claim 7, wherein the auxiliary warpage-suppressing member further comprises a second auxiliary warpage-suppressing line extended in a direction substantially parallel to the side of the insulating substrate.

9. The package substrate of claim 6, wherein the auxiliary warpage-suppressing member comprises a metal tape.

10. A semiconductor package comprising:
a package substrate including an insulating substrate, internal circuits and a warpage-suppressing member, the insulating substrate having a plurality of mount regions and a peripheral region, the internal circuits formed in the mount regions of the insulating substrate, and the warpage-suppressing member arranged on at least one of the mount regions to suppress a warpage of the insulating substrate; and
semiconductor chips mounted on mount regions different from the at least one of the mount regions, the semiconductor chips being electrically connected to the internal circuits,
wherein at least one of the internal circuits is a normal internal circuit and at least one of the internal circuits is an abnormal internal circuit, wherein the semiconductor chips are mounted on mount regions in which normal internal circuits are formed, and the warpage-suppressing member is arranged on the mount region in which an abnormal internal circuit is formed.

11. The semiconductor package of claim 10, wherein the semiconductor chips include bonding pads, the semiconductor package further comprising conductive bumps interposed between the semiconductor chips and the insulating substrate to electrically connect the bonding pads of the semiconductor chips with the internal circuits.

12. The semiconductor package of claim 10, wherein the semiconductor chips include bonding pads, the semiconductor package further comprising conductive wires configured to electrically connect the bonding pads of the semiconductor chips with the internal circuits.

13. The semiconductor package of claim 10, wherein the package substrate comprises:
a first auxiliary warpage-suppressing line extended in a direction substantially perpendicular to a side of the insulating substrate in the peripheral region;
a second auxiliary warpage-suppressing line extended in a direction substantially parallel to the side of the insulating substrate in the peripheral region.

14. A semiconductor package comprising:
an insulating substrate having a plurality of mount regions;
internal circuits formed in the mount regions, wherein a plurality of the internal circuits are normal internal circuits and at least one of the internal circuits is an abnormal internal circuit;
semiconductor chips mounted on mount regions in which normal internal circuits are formed; and
a warpage-suppressing member arranged on a mount region in which an abnormal internal circuit is formed.

15. The semiconductor package of claim 14, further comprising an adhesive interposed between the warpage-suppressing member and the insulating substrate.

16. The semiconductor package of claim 14, wherein the warpage-suppressing member comprises a metal tape.

17. The semiconductor package of claim 14, wherein the insulating substrate includes a peripheral region surrounding the plurality of mount regions and wherein no internal circuits are formed in the peripheral region.

18. The semiconductor package of claim 17, further comprising at least one auxiliary warpage-suppressing member arranged in the peripheral region.

* * * * *